United States Patent [19]

Nagashima

[11] 3,935,486

[45] Jan. 27, 1976

[54] FINELY ADJUSTABLE TABLE ASSEMBLY

[75] Inventor: Mitsuyoshi Nagashima, Sayama, Japan

[73] Assignee: Citizen Watch Co., Ltd., Tokyo, Japan

[22] Filed: Aug. 26, 1974

[21] Appl. No.: 500,345

[30] Foreign Application Priority Data

Aug. 27, 1973 Japan.............................. 48-95844

[52] U.S. Cl. ..................... 310/12; 335/268; 318/38; 318/115
[51] Int. Cl.² ...................................... H02K 41/02
[58] Field of Search ............................... 310/12–14, 310/27, 51, 74; 318/35, 37, 38, 135, 687; 335/266, 268, 279, 281, 229, 230; 73/71.6; 79/579; 188/1 B; 355/53; 269/58

[56] References Cited
UNITED STATES PATENTS

| | | | |
|---|---|---|---|
| 2,925,503 | 2/1960 | Efromson............................ | 310/27 |
| 3,075,100 | 1/1963 | Efromson............................ | 310/27 |
| 3,163,786 | 12/1964 | Dickinson........................... | 310/27 |
| 3,286,109 | 11/1966 | Madsen.............................. | 310/51 X |
| 3,357,511 | 12/1967 | Mackie............................... | 310/13 X |
| 3,656,014 | 4/1972 | Rich................................... | 310/13 |
| 3,744,902 | 7/1973 | Heuker............................... | 355/53 |
| 3,789,285 | 1/1974 | Nishizawa.......................... | 335/268 X |

*Primary Examiner*—Donovan F. Duggan
*Attorney, Agent, or Firm*—Ernest G. Montague; Karl F. Ross; Herbert Dubno

[57] ABSTRACT

A finely adjustable table assembly is particularly useful, for example, as a light-exposing device for printing IC (integrated-circuits) patterns and comprises a base plate, a movable table, a plurality of curved plate springs for connecting the movable plate to the base plate, and a non-contact means for driving the movable table. The curved plate springs are arranged perpendicularly to their widths between the movable table and the base plate and, as a result, the mass of the movable table is supported by the curved plate springs. As the table driving means, use is made of a non-contact type drive such as an electromagnetic device. The table is capable of being displaced in any direction in a horizontal plane. This displacement can be effected in a highly precise manner because of the absence of mechanical sliding members.

2 Claims, 10 Drawing Figures

FINELY ADJUSTABLE TABLE ASSEMBLY

BACKGROUND OF THE INVENTION

1. Field of the Invention

This invention relates to a finely adjustable table assembly which is particularly useful, for example, as part of a light-exposing device for printing integrated circuit patterns.

2. Description of the Prior Art

A of table for this purpose heretofore proposed comprises two sliders arranged perpendicularly to each other and adapted to be slidable while making contact at their metallic surfaces with each other. Another conventional table device which makes use of balls or rollers disposed between adjacent sliding surfaces has been described in U.S. patent No. 3,744,902. These conventional table devices have the disadvantage that it is difficult to effect highly sensitive and minute feed of the movable table owing to mechanical friction. Another table has been proposed which subjects the lower surface to an air stream or magnetic repulsive force so as to raise it. This conventional table is complex in construction and not stable in operation. As seen from the above, all of the conventional tables are complex and expensive and do not satisfy the precision required for this kind of device.

SUMMARY OF THE INVENTION

An object of the invention is to provide a finely adjustable table device which can obviate the above-mentioned disadvantages which have been encountered with the conventional tables and which can displace a movable table in any desired direction in the X-Y (horizontal) plane owing to the absence of mechanical friction and backlash.

BRIEF DESCRIPTION OF THE DRAWINGS

The invention will now be described in greater detail with reference to the accompanying drawing, wherein.

DETAILED DESCRIPTION OF THE INVENTION

Figure 1:
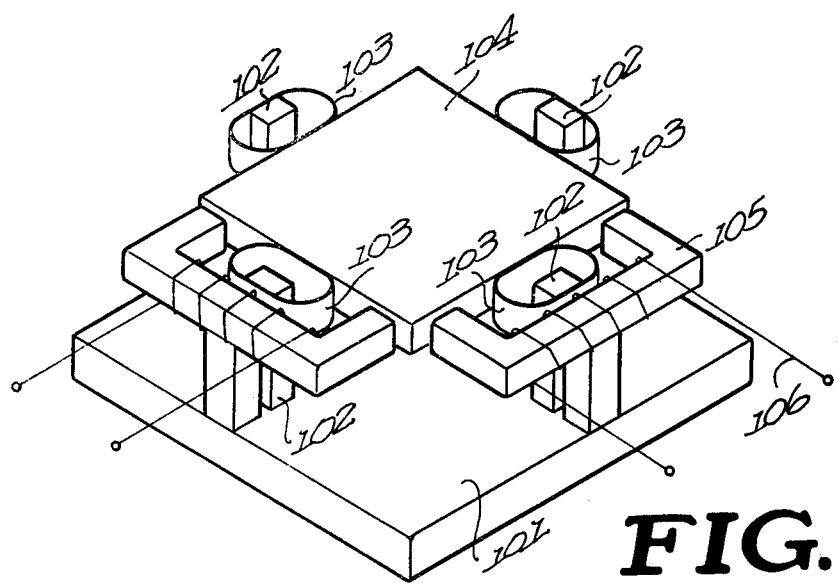
FIG. 1 is a diagrammatic perspective view of one embodiment of the assembly according to the invention.

In FIG. 1, a base plate 101 has four columns 102 secured at their respective lower ends to the base plate 101. Four curved-plate springs 103 connect the movable table 104 to the four columns 102. In the present embodiment, each curved-plate spring 103 is annular in section. These curved plate springs 103 are arranged perpendicularly in their widthwise direction laterally of the movable table 104 as shown in FIG. 1 (i.e., with the axis and generatrices of the spring perpendicular to the table and the bights of the spring disposed between the respective column and a lateral edge of the table 104) so that the mass of the movable table 104 is supported by the four curved plate springs 103 and the movable table 104 is not provided with any mechanical sliding member. The two U-shaped electromagnets 105, each having two legs are opposed to respective adjacent sides of the movable table 104 and a coil 106 wound around the common core of the legs. If either or both of these coils 106 is or are energized, the movable table 104 is displaced in a non-contact manner.

Figure 2:
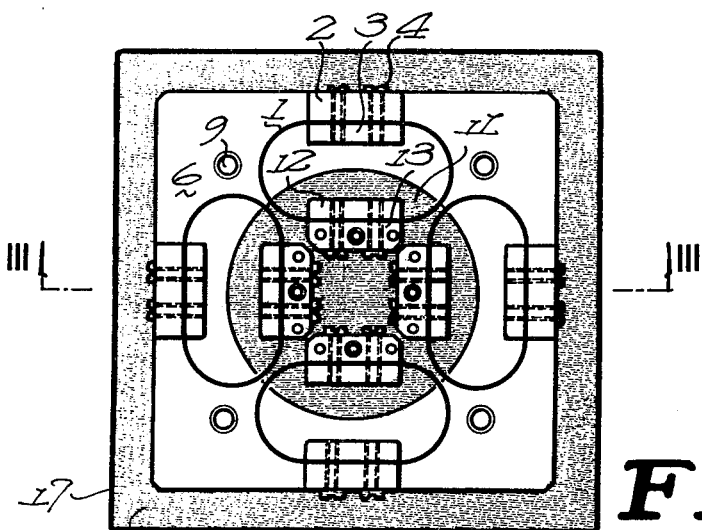
FIG. 2 is a plan view of another embodiment of the assembly according to the invention, the movable table being omitted for ease of illustration.
Figure 3:
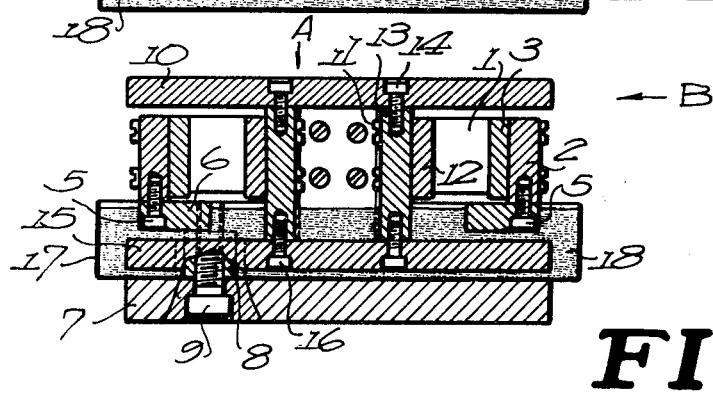
FIG. 3 is a section taken along line III—III of FIG. 2 with the movable table in place.

In FIGS. 2 and 3 is shown another embodiment of the finely adjustable table device according to the invention. In this device there are four curved-plate springs 1 which are arranged at positions angularly spaced apart from each other by 90°C. One side of each of these curved plate springs 1 is sandwiched between a spring-supporting member 2 and a counter plate 3 and is secured thereto by means of screws 4. As shown in FIG. 3, the spring supporting member 2 is secured to the mounting plate 6 by means of vertical screws 5.

Referring to FIG. 3, a base plate 7 is secured to the mounting plate 6 by means of a screw 9 extending through a sleeve 8 inserted between the base plate 7 and the mounting plate 6.

A movable table 10 is secured to a table-supporting member 13 by means of screws 14. The table-supporting plate 13 is opposed to the spring supporting member 2 and serves to hold the opposite side of the curved plate spring 1 sandwiched between the table supporting member 13 and a counter plate 12 and secured therebetween by means of screws 11. In the embodiment shown in FIG. 3, the center part of the movable table 10 is mounted upon by the table supporting members 13 and the spring supporting members 2 are arranged below the outer peripheral portion of the movable table 10. Alternatively, the spring supporting members 2 may be arranged below the center part of the movable table 10 and the outer peripheral portion of the table 10 may be supported by the table supporting member 13.

A damper member is secured to the table supporting members 13 by means of screws 16 and is immersed into a damper liquid 18 in a container 17 disposed on the base plate 7.

The container 17 is provided at its base with a hole through which extends the screw 9. A gap formed between the hole and the screw 9 is hermetically sealed by a packing (not shown) to prevent the damper liquid 18 from leaking through the gap out of the container 17.

Figure 4:
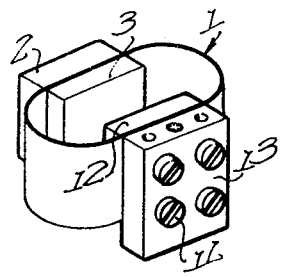
FIG. 4 is a perspective view of a curved plate spring used in FIGS. 1, 2 and 3.

In FIG. 4 is shown the curved plate spring 1 secured at its one side to the spring-supporting members 2 and its counter plate 3 by means of the screws 4 and at its opposed side to the table-supporting member 13 and its counter plate 12 by means of the screws 11. The curved plate spring 1 shown in FIG. 4 is of substantially annular in cross-section.

Figure 5:
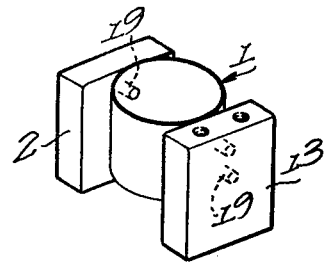
FIGS. 5 and 6 are perspective views of two modified curved-plate springs, respectively.

In FIG. 5 is shown a curved plate spring 1 which is circular in cross-section and to diametrically opposite positions of which are secured a spring-supporting member 2 and a table supporting member 13 by means of pins 19, respectively, each pin 19 having one end secured to the curved plate spring 1 and a free end extending through the members 2, 13 and calked thereto.

Figure 6:
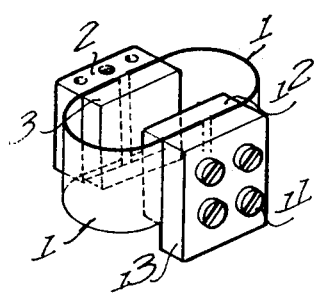
Figure 7:
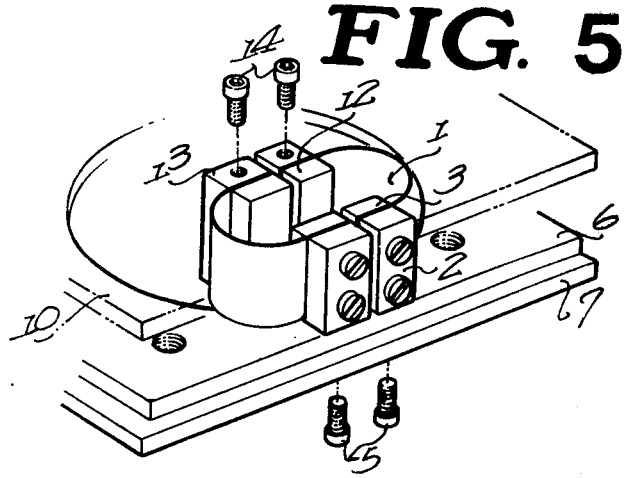
FIG. 7 is a perspective view of a curved-plate spring as shown in FIG. 6 in position for supporting the movable table above a base plate.

In the above-mentioned embodiments, the curved-plate spring 1 is endless. Alternatively, the curved-plate spring 1 may be composed of two U-shaped halves opposed to each other with gaps therebetween. These opposed end regions may be sandwiched between the spring-supporting member 2 and its counter plate 3 and between the movable-table supporting member 13 and its counter plate 12, respectively, and secured thereto by means of the screws 4, 11 as shown in FIG. 6. As shown in FIG. 7, the spring-supporting member 2 is secured to the mounting plate 6 by means of the screws 5 and the table supporting member 13 is secured to the movable table 10 by means of the screws 14.

Figure 8:
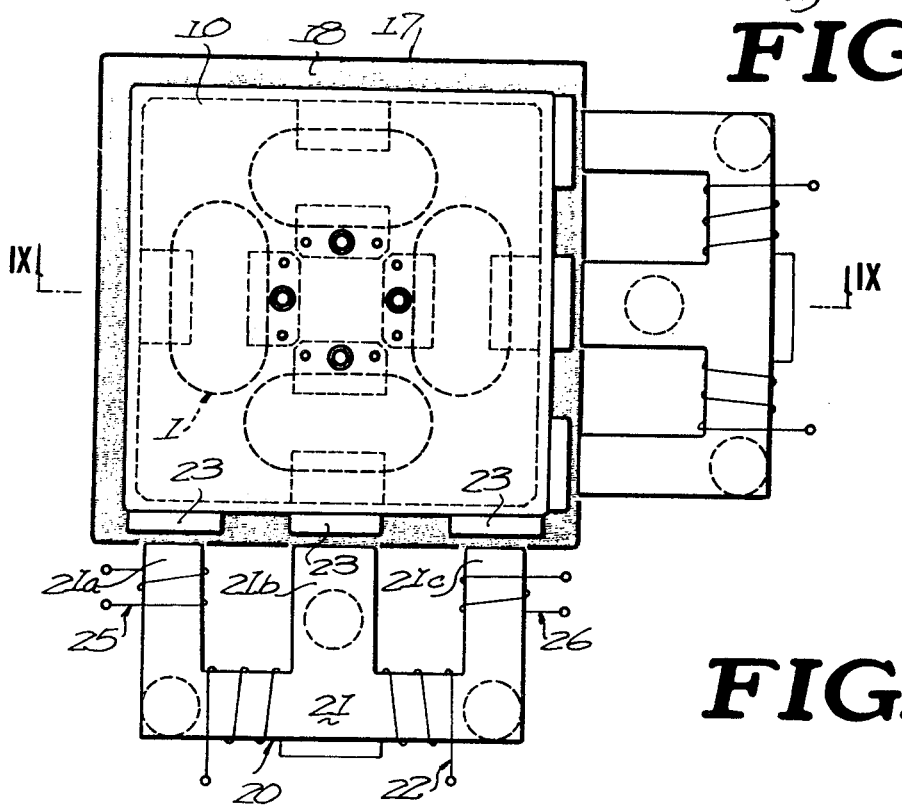
FIG. 8 is a plan view of electromagnets arranged in opposition to and adjacent two adjoining sides of a table according to the invention.
Figure 9:
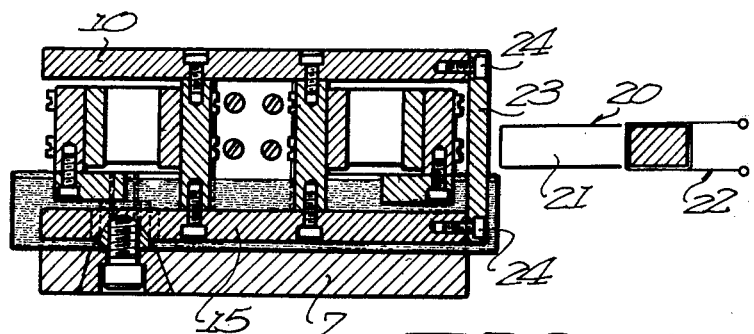
FIG. 9 is a section taken along line IX—IX of FIG. 8.

FIGS. 8 and 9 show another emobdiment of the table according to the invention.

Referring to FIG. 8, an electromagnet 20 composed of an E-shaped iron core 21 has three legs 21a, 21b, 21c and a coil 22 wound around the iron core 21. The two electromagnets 20 are angularly spaced from each other by 90° and arranged in opposition to two adjacent sides of the movable table 10.

Iron pieces 23 are secured to those portions of the movable table 10 and the damper member 15 which are directly opposed to the legs 21a, 21b, 21c of the E-shaped iron core 21 by means of screws 24, respectively, as shown in FIG. 9. The movable table 10 and the damper member 15 are each made of non-magnetic material.

Reference numerals 25, 26 designate coils wound around the legs 21a, 21c of the iron core 21, respectively. These coils 25, 26 are energized when it is desired to slightly rotate the movable table 10 in its horizontal plane. The coils 25,26 must be wound around the legs 21a, 21c such that the magnetic force produced in the electromagnet 20 when the coils 25, 26 are energized is added to the magnetic force produced in the electromagnet 20 when the coil 22 is energized.

In the embodiment of FIGS. 8 and 9, the movable table 10 is electromagnetically driven. The movable table 10 may also be driven by fluid pressure such as an air jet stream and the like without utilizing solid contact.

As stated hereinbefore, the table device according to the invention is capable of maintaining the movable table 10 at standstill under the balance of the spring forces of the four curved plate springs 1. The movable table 10 is supported by vertical planes in parallel with the widthwise direction of the curved plate spring 1, and as a result, it is difficult to displace the movable table 10 by an exterior force applied in a vertical direction as shown by an arrow A in FIG. 3, but it is easy to displace the movable table 10 by an external force applied to it in a transverse direction as shown by an arrow B in FIG. 3. In the latter case, it is possible to reliably displace the movable table 10 in the direction B along which the exterior force is applied to the movable table 10. That is, the magnetic force of the electromagnet 20 causes the movable table 10 to be displaced in the plane thereof in all the X, Y, directions the resultant direction of X and Y and the like.

Figure 10:
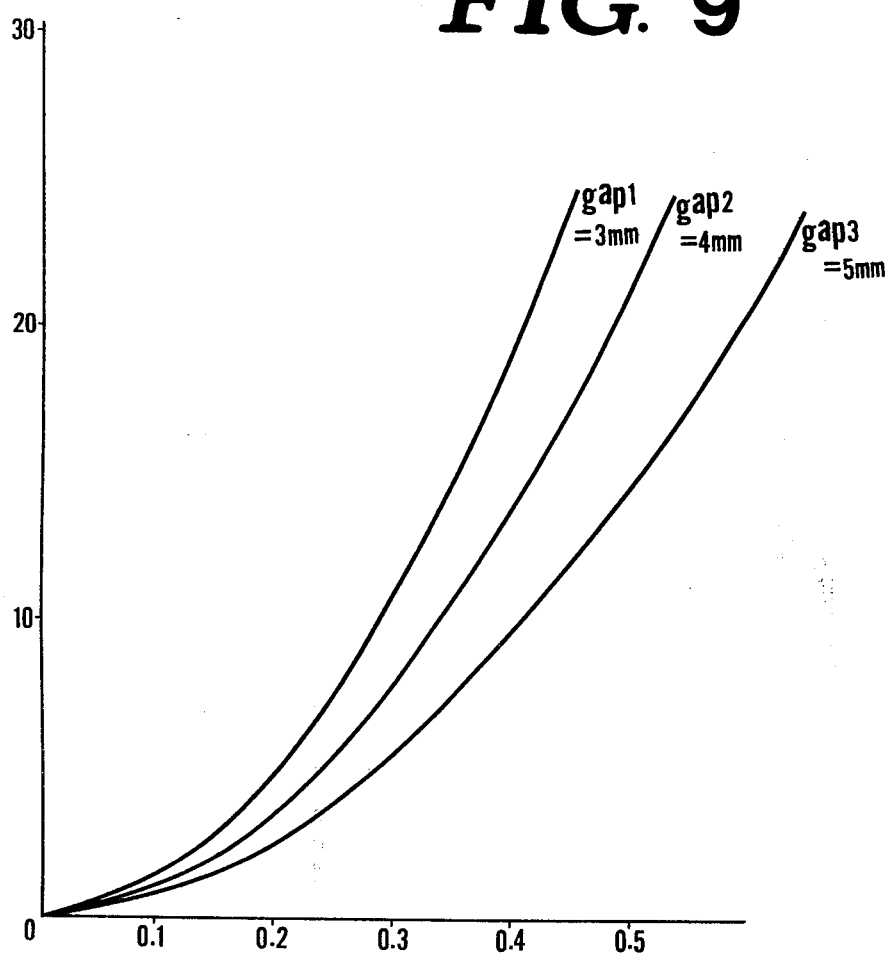
FIG. 10 is a graph illustrating the displacement characteristic of the table according to the invention.

FIG. 10 shows a graph illustrating the current vs. displacement characteristic of the table according to the invention with the gap (mm) formed between the electromagnet 20 and the iron piece 23 taken as parameter.

As seen from FIG. 10, the displacement of the movable table 10 is proportional to the current flowing through the coil 22 of the electromagnet 20. It is possible to precisely displace the movable table 10 in proportion to the current flowing through the coil 22 of the electromagnet 20. In the case of displacement of the movable table 10, a constant frictional resistance such as the slight internal friction of the curved plate spring 1, friction between the damper liquid 18 and the damper member 15 immersed therein and the like, acts upon the movable table 10, but this frictional resistance is constant and has no influence upon the accuracy of displacement of the movable table 10.

The movable table 10 according to the invention provides an oscillation system maintained by the curved-plate springs 1 and attenuated by the damper liquid 18. In the present embodiment, the damper liquid 18 is a silicone oil having a viscosity of 100 to 300 centistokes. The damper member 15 serves to significantly attenuate the oscillations of the movable table 10. Those portions of the damper member 15 which are not used for supporting the curved plate springs 1 may be made open for the purpose of enlarging the surface area of the damper member 15 so as to further increase the attenuation effect.

As stated hereinbefore, the invention provides a finely adjustable table device which is not subjected to friction and wear, which has no backlash region, which can operate for a long time without necessitating any troublesome periodic inspection, and which can displace a movable table in a minimum increment of 1/10,000 (mm) in a stable state.

In addition, the device according to the invention is not required to have the machining precision for X-Y axes which has been encountered with the conventional table device and is simple in construction and less expensive.

What is claimed is:

1. A finely adjustable table assembly comprising:
   a base plate;
   a movable table above said plate;
   a plurality of angularly spaced columns mounted on said base plate, said table having respective surfaces disposed horizontally opposite said columns;
   a plurality of plate springs which are annular in section and are connected to said columns and to said surfaces of said table so as to have their generatrices perpendicular to said movable table and the broad surfaces of the plates of said springs facing generally horizontally; and
   electromagnetic driving means for driving said movable table relative to said base plate, said electromagnetic driving means being composed of a plurality of electromagnets at least one of which comprises an E-shaped magnetic core and at least two coils so as to minutely displace said movable plate in any direction in the same horizontal plane.

2. A finely adjustable table assembly as defined in claim 1, further comprising a table-supporting member forming said table surfaces, a damper member and a container for a damper liquid, and said movable table being connected through said table-supporting member to said damper member immersed in said damper liquid in said container so as to prevent a free oscillation of said movable table.

* * * * *